(12) United States Patent
Chen

(10) Patent No.: US 10,446,331 B2
(45) Date of Patent: Oct. 15, 2019

(54) WAFER-CAPPED RECHARGEABLE POWER SOURCE

(71) Applicant: ANALOG DEVICES, INC., Norwood, MA (US)

(72) Inventor: Baoxing Chen, Westford, MA (US)

(73) Assignee: Analog Devices, Inc., Norwood, MA (US)

(*) Notice: Subject to any disclaimer, the term of this patent is extended or adjusted under 35 U.S.C. 154(b) by 231 days.

(21) Appl. No.: 14/861,725

(22) Filed: Sep. 22, 2015

(65) Prior Publication Data

US 2017/0084888 A1    Mar. 23, 2017

(51) Int. Cl.
| | |
|---|---|
| *H05K 7/20* | (2006.01) |
| *H01G 11/28* | (2013.01) |
| *H01G 11/58* | (2013.01) |
| *H01G 11/84* | (2013.01) |
| *H01G 11/78* | (2013.01) |
| *H05K 1/18* | (2006.01) |
| *H05K 1/11* | (2006.01) |
| *H01M 10/04* | (2006.01) |
| *H01M 10/42* | (2006.01) |
| *H01G 11/26* | (2013.01) |
| *H01G 11/56* | (2013.01) |

(Continued)

(52) U.S. Cl.
CPC .......... *H01G 11/28* (2013.01); *H01G 11/26* (2013.01); *H01G 11/56* (2013.01); *H01G 11/58* (2013.01); *H01G 11/60* (2013.01); *H01G 11/62* (2013.01); *H01G 11/78* (2013.01); *H01G 11/84* (2013.01); *H01M 10/0436* (2013.01); *H01M 10/0463* (2013.01); *H01M 10/425* (2013.01); *H05K 1/115* (2013.01); *H05K 1/181* (2013.01); *H01G 11/46* (2013.01); *H01M 6/40* (2013.01); *H01M 2220/30* (2013.01); *H05K 2201/10015* (2013.01); *H05K 2201/10037* (2013.01); *H05K 2201/10234* (2013.01)

(58) Field of Classification Search
CPC ........ H01G 11/28; H01G 11/58; H01G 11/78; H01G 11/84; H01M 10/0436; H01M 10/0463; H01M 10/425; H01M 2220/30; H01M 6/40; H05K 1/115; H05K 1/181; H05K 2201/10015; H05K 2201/10037; H05K 2201/10234
See application file for complete search history.

(56) References Cited

U.S. PATENT DOCUMENTS 5,561,004 A   10/1996  Bates et al.
5,591,679 A   1/1997   Jakobsen et al.
(Continued)

OTHER PUBLICATIONS

N.J. Dudney, "Solid-State Thin-Film Rechargeable Batteries," Materials Science and Engineering B, vol. 116, No. 3, Feb. 2005, pp. 245-249.

*Primary Examiner* — Yuriy Semenenko
(74) *Attorney, Agent, or Firm* — Wolf, Greenfield & Sacks, P.C.

(57) ABSTRACT

Embodiments of the present invention may provide a wafer-capped rechargeable power source. The wafer-capped rechargeable power source may comprise a device wafer, a rechargeable power source disposed on a surface of the device wafer, and a capping wafer to encapsulate the rechargeable power source. The rechargeable power source may include an anode component, a cathode component, and an electrolyte component.

30 Claims, 11 Drawing Sheets

(51) Int. Cl.
    *H01G 11/60*     (2013.01)
    *H01G 11/62*     (2013.01)
    *H01M 6/40*     (2006.01)
    *H01G 11/46*     (2013.01)

(56) References Cited

U.S. PATENT DOCUMENTS

| | | | | |
|---|---|---|---|---|
| 5,597,660 | A * | 1/1997 | Bates | H01L 23/58 |
| | | | | 429/322 |
| 5,604,160 | A | 2/1997 | Warfield | |
| 5,915,168 | A | 6/1999 | Salatino et al. | |
| 8,343,806 | B2 | 1/2013 | Chahal et al. | |
| 9,887,429 | B2 * | 2/2018 | Shih | H01M 10/0436 |
| 2001/0032666 | A1 * | 10/2001 | Jenson | A61N 1/3787 |
| | | | | 136/256 |
| 2005/0001214 | A1 * | 1/2005 | Brun | G06K 19/073 |
| | | | | 257/59 |
| 2008/0003492 | A1 * | 1/2008 | Bates | H01M 2/0207 |
| | | | | 429/66 |
| 2008/0081398 | A1 | 4/2008 | Lee et al. | |
| 2008/0286651 | A1 * | 11/2008 | Neudecker | H01M 4/0404 |
| | | | | 429/209 |
| 2011/0128712 | A1 * | 6/2011 | Prest | G06F 1/1626 |
| | | | | 361/783 |
| 2012/0244429 | A1 * | 9/2012 | Lam | H01G 11/46 |
| | | | | 429/211 |
| 2015/0191345 | A1 * | 7/2015 | Boysel | B81B 7/007 |
| | | | | 257/774 |
| 2015/0357124 | A1 * | 12/2015 | Waterford | H01G 11/78 |
| | | | | 429/82 |

\* cited by examiner

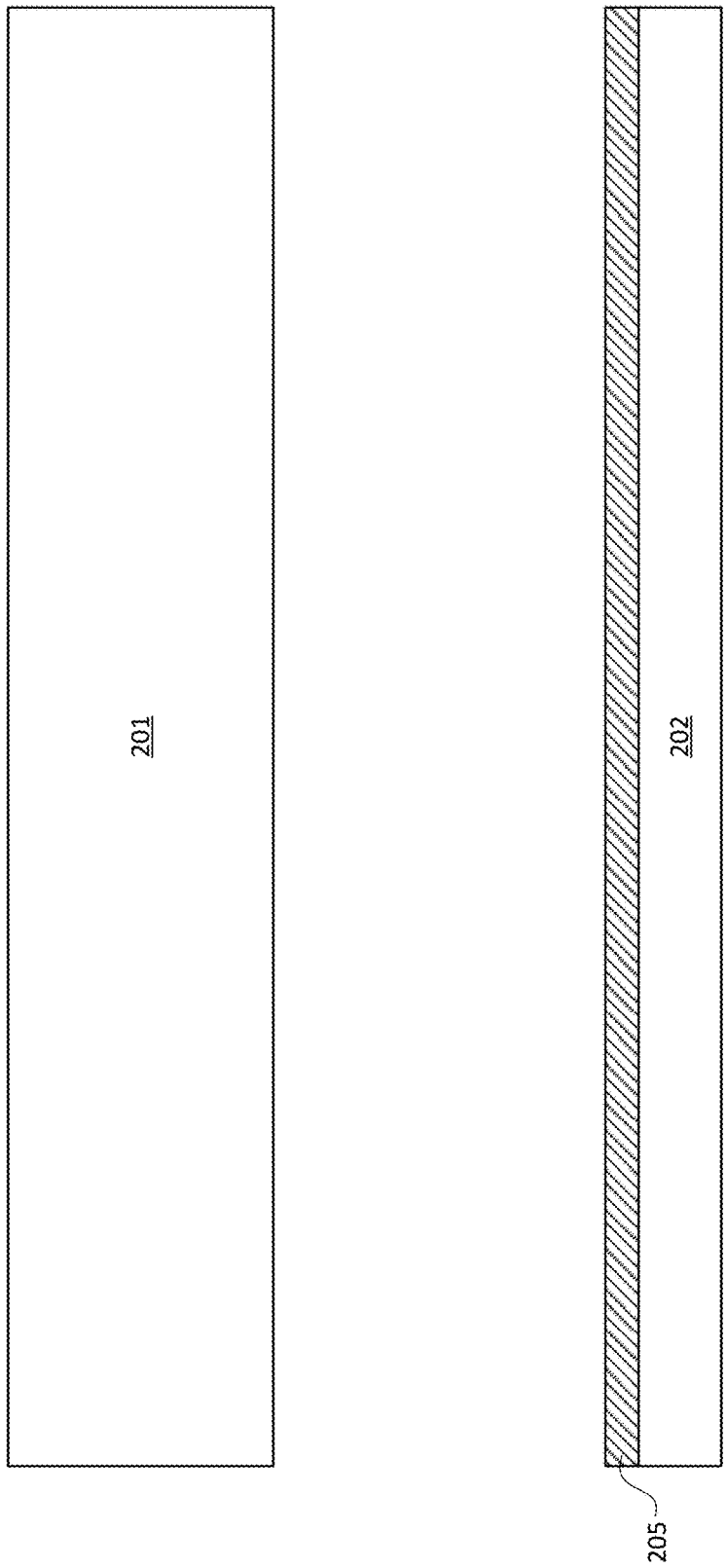

WAFER-CAPPED RECHARGEABLE POWER SOURCE

BACKGROUND

The present invention relates to rechargeable power sources.

Electronic devices, such as smartphones, laptops, digital cameras, watches, etc., generally require a power source, which is usually provided in the form of rechargeable battery packs. These rechargeable battery packs typically account for a major portion of the size and weight of the electronic devices. With an ongoing need to miniaturize and/or lighten such electronic devices, it is desirable to find new solutions for powering these electronic devices.

Given that most electronic devices include a plurality of integrated circuits, one solution is to fabricate the rechargeable power sources also on integrated circuits. While there are existing techniques to fabricate rechargeable batteries on substrates, the materials being used for the batteries are typically flammable and/or sensitive to high temperatures, which are common in the manufacturing of integrated circuits. These materials being also usually sensitive to moisture, it is desirable to have them hermetically sealed.

Therefore, the inventor perceives a need in the art for a rechargeable power source that may maintain its power capacity over time and that may be fabricated on a substrate and included in an integrated circuit, while reducing the risk of explosion of the rechargeable power source and preventing the rechargeable power source from being damaged by heat during manufacturing.

BRIEF DESCRIPTION OF THE DRAWINGS

FIGS. 2A-2F illustrate cross-sections of wafer-capped rechargeable power sources at various stages during the manufacturing process according to an embodiment of the present invention.

DETAILED DESCRIPTION

Embodiments of the present invention may provide a wafer-capped rechargeable power source. The wafer-capped rechargeable power source may comprise a device wafer, a rechargeable power source disposed on a surface of the device wafer, and a capping wafer to encapsulate the rechargeable power source. The rechargeable power source may include an anode component, a cathode component, and an electrolyte component.

Embodiments of the present invention may provide a circuit with an integrated rechargeable power source. The circuit may comprise a circuit board and a device mounted on the circuit board. The device may comprise a device wafer, a rechargeable power source disposed on a surface of the device wafer, and a capping wafer attached over the rechargeable power source forming a cavity between the rechargeable power source and the device wafer. The circuit may further comprise a plurality of devices mounted on the circuit board, wherein the device may be electrically connected to at least one of the plurality of devices Embodiments of the present invention may provide method of manufacturing a wafer-capped rechargeable power source. The method may comprise the steps of providing a top wafer and a device wafer; forming a rechargeable power source on a surface of the device wafer; forming a capping wafer from the top wafer; and attaching the capping wafer over the rechargeable power source to encapsulate the rechargeable power source.

Figure 1:
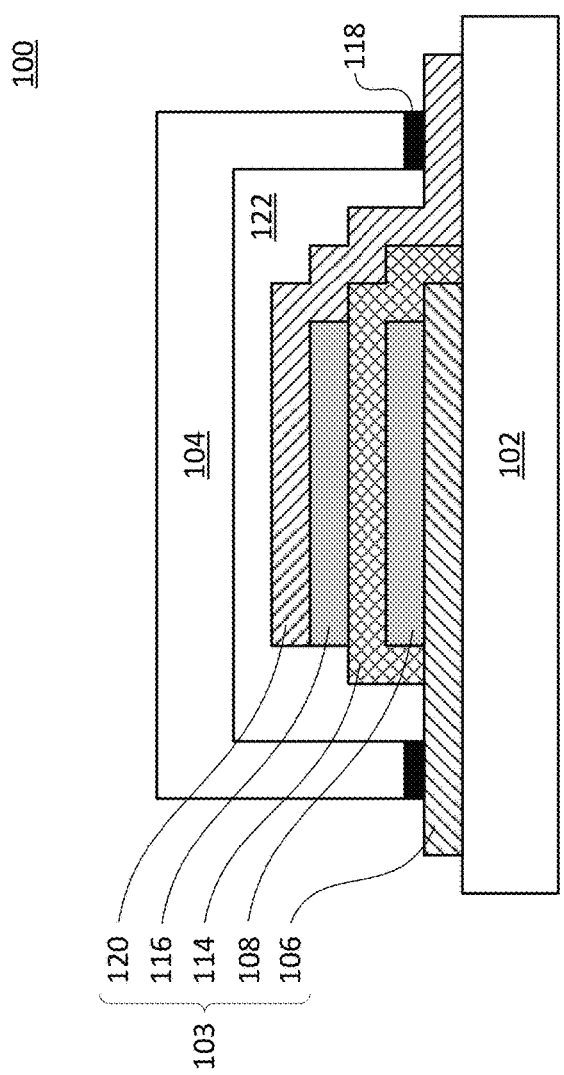
FIG. 1 illustrates a cross-section of a wafer-capped rechargeable power source according to an embodiment of the present invention.

FIG. 1 illustrates a cross-section of a wafer-capped rechargeable power source 100 according to an embodiment of the present invention. The wafer-capped rechargeable power source 100 may include a device wafer 102, a rechargeable power source 103, and a capping wafer 104.

The device wafer 102 may have an active surface and a back surface. The rechargeable power source 103 may be disposed on the back surface of the device wafer 102. The rechargeable power source 103 may include a cathode current collector 106, a cathode component 108, an electrolyte component 114, an anode component 116, and an anode current collector 120. In an embodiment, the rechargeable power source 103 may be provided as a battery or a super capacitor (i.e., no dielectric). Other devices may be formed on the active side of the device wafer 102.

The electrolyte component 114 may be in the form of an organic material or an ionic liquid material. When the electrolyte component 114 is formed of an organic material such as propylene carbonate, ethylene carbonate, or dimethyl carbonate, the cathode current collector 106, the cathode component 108, the anode component 116, and the anode current collector 120 may be formed of metals of good conductivity such as aluminum, copper, or gold. When the electrolyte component 114 is formed of an ionic liquid material such as 1-buthyl-3-methylimidazolium ([BMIM][Cl]), trioctylmethylam monium bis(trifluoromethylsulfonyl)imide ([OMA][TFSI]), or triethylsulfonium bis(trifluoromethylsulfonyl)imide ([SET3][TFSI]), the cathode current collector 106, the cathode component 108, the anode component 116, and the anode current collector 120 may be formed of porous carbon, graphene, or carbon nanotube.

To prevent the electrolyte component 114 from degrading, exploding, or being damaged during the manufacturing process of the wafer-capped rechargeable power source 100, the capping wafer 104 may be attached to the device wafer 102 to encapsulate the rechargeable power source 103 at a low temperature, for example below 200° C. As illustrated in FIG. 1, the capping wafer 104 may be attached over the rechargeable power source 103 with a bonding material 118, which may be made of bismuth-tin alloys.

Moreover, attaching the capping wafer 104 over the rechargeable power source 103 in a vacuum chamber or a chamber containing an inert gas such as nitrogen may form a vacuum or inert gas cavity 122. The vacuum or inert gas cavity 122 further reduces the risk of explosion of the rechargeable power source 103. Encapsulating the rechargeable power source 103 with the capping wafer 104 as described may also create a moisture barrier, which may prevent external moisture from entering the cavity 122, thus preventing corrosion of the different components of the rechargeable power source 103. As shown in FIG. 1, the cathode current collector 106 and the anode current collector 120 extend outside of the capping wafer 104 to allow connection to other devices (not shown) for charging and discharging of the rechargeable power source 103.

A method of manufacturing a plurality of wafer-capped rechargeable power source, according to an embodiment of the present invention, will now be described with respect to FIGS. 2A-2F, which depict cross-sections of the wafer-capped rechargeable power sources at various stages during its manufacturing process.

In FIG. 2A, a top wafer 201 and a device wafer 202 may be provided at a stage of the manufacturing process. At this stage, the device wafer 202 may have already undergone other manufacturing steps such that one or both surfaces of the device wafer 202 are made to be active. For example, the surface(s) or sections of the surface(s) of the device wafer 202 may have been positively and/or negatively doped. Further at this stage, a metal layer 205 may be formed on one of the surfaces of device wafer 202. The metal layer 205 may be formed of metals with good conductivity, such as aluminum, copper, or gold. The thickness of the metal layer 205 may be in the range of a few micrometers (microns).

Figure 2B:
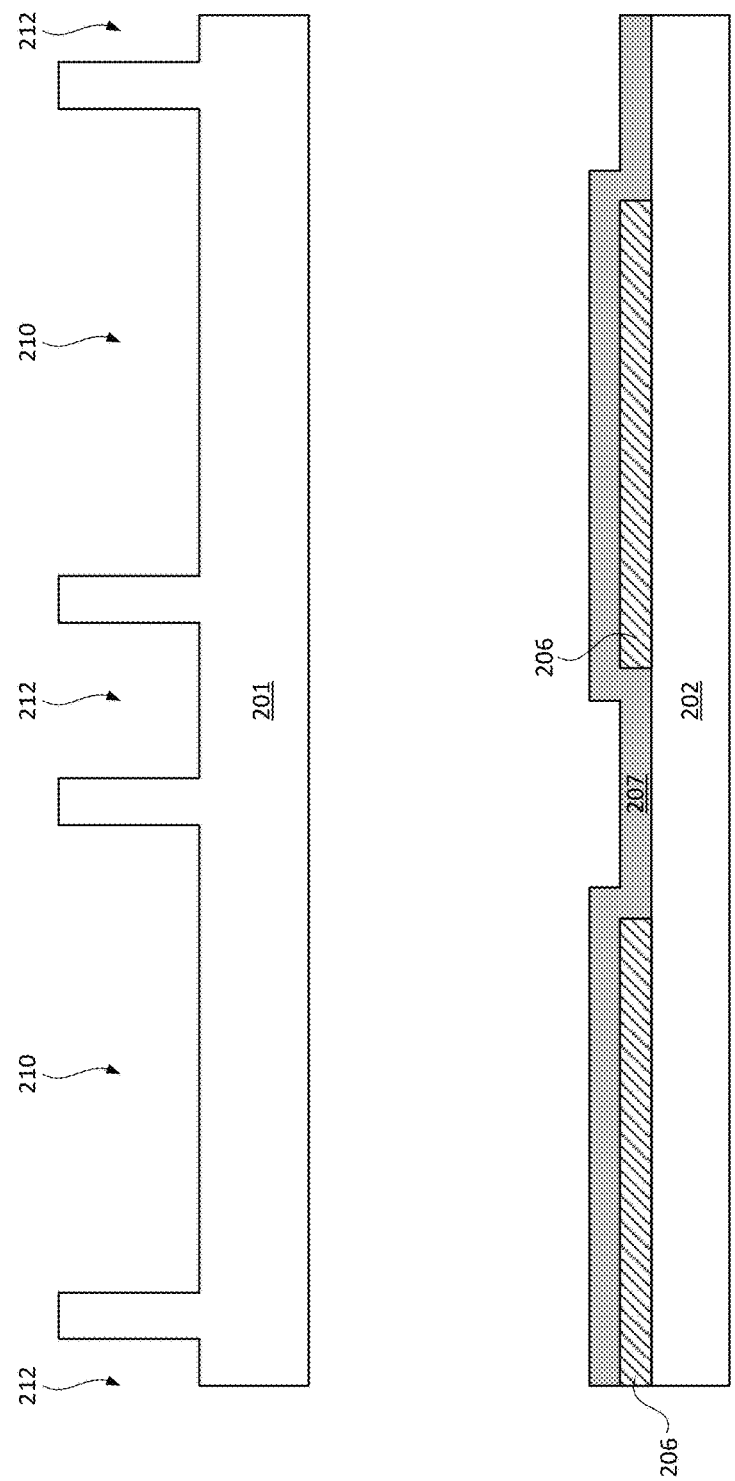

FIG. 2B depicts a subsequent stage in the manufacturing process, where portions of the metal layer 205 may be etched to form cathode current collectors 206. A cathode layer 207 may be formed over the cathode current collectors 206. The cathode layer 207 may be formed of porous carbon, graphene, or carbon nanotube. The thickness of the cathode layer 207 may be in the range of tens to hundreds of microns. On the other hand, portions of the top wafer 201 may be etched to form cavities 210 and 212 having a depth that is adequate to encapsulate rechargeable power sources that will eventually be formed.

Figure 2C:
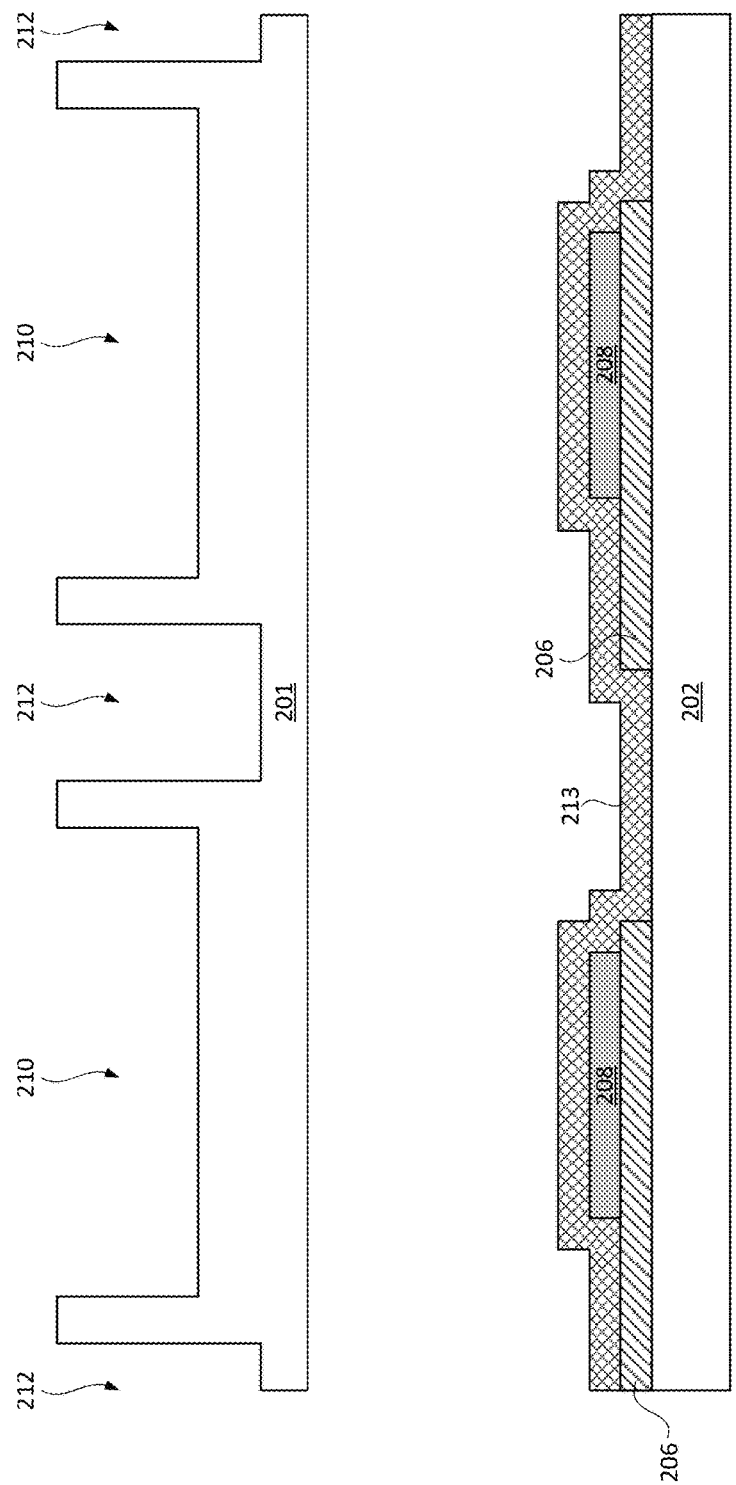

At the manufacturing stage shown in FIG. 2C, portions of the cathode layer 207 may be etched to form cathode components 208. An electrolyte layer 213 may be formed over the cathode components 208 and the cathode current collectors 206. The electrolyte layer 213 may be formed of an organic material such as propylene carbonate, ethylene carbonate, or dimethyl carbonate, or an ionic liquid material such as 1-buthyl-3-methylimidazolium ([BMIM][Cl]), tri-octylmethylam monium bis(trifluoromethylsulfonyl)imide ([OMA][TFSI]) or triethylsulfonium bis(trifluoromethylsulfonyl)imide ([SET3][TFSI]). The thickness of the electrolyte layer 213 may be in the range of tens to hundreds of microns. With appropriate masking techniques (not shown for brevity), further etching may be carried out to deepen the cavities 212, while keeping the depth of the cavities 210 unchanged. This will allow, as will be shown in a later manufacturing stage, the polishing of the top wafer 201 such that separate capping wafers may be formed.

Figure 2D:
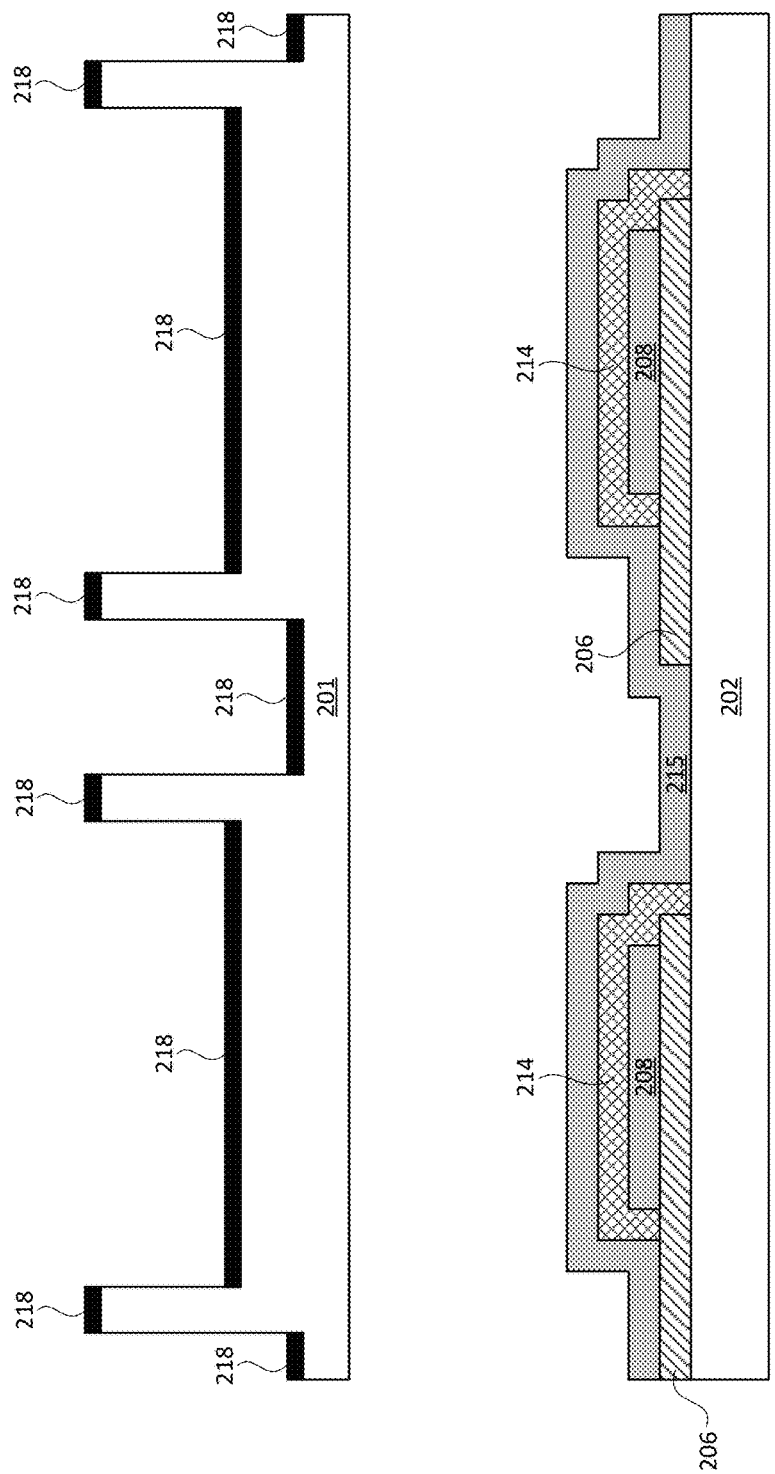

FIG. 2D depicts a further point in the manufacturing process, where the electrolyte layer 213 may be etched to form electrolyte components 214, enclosing the cathode components 208. An anode layer 215 may be formed over the electrolyte components 214 and the cathode current collectors 206. The anode layer 216 may be formed of porous carbon, graphene, or carbon nanotube. The thickness of the anode layer 215 may be in the range of tens to hundreds of microns. As shown in FIG. 2D, a bonding material layer 218 may be deposited on the upper horizontal surfaces of the top wafer 201. The bonding material layer 218 may be formed of bismuth-tin alloys. The thickness of the bonding material layer 218 may be in the range of a few microns.

Figure 2E:
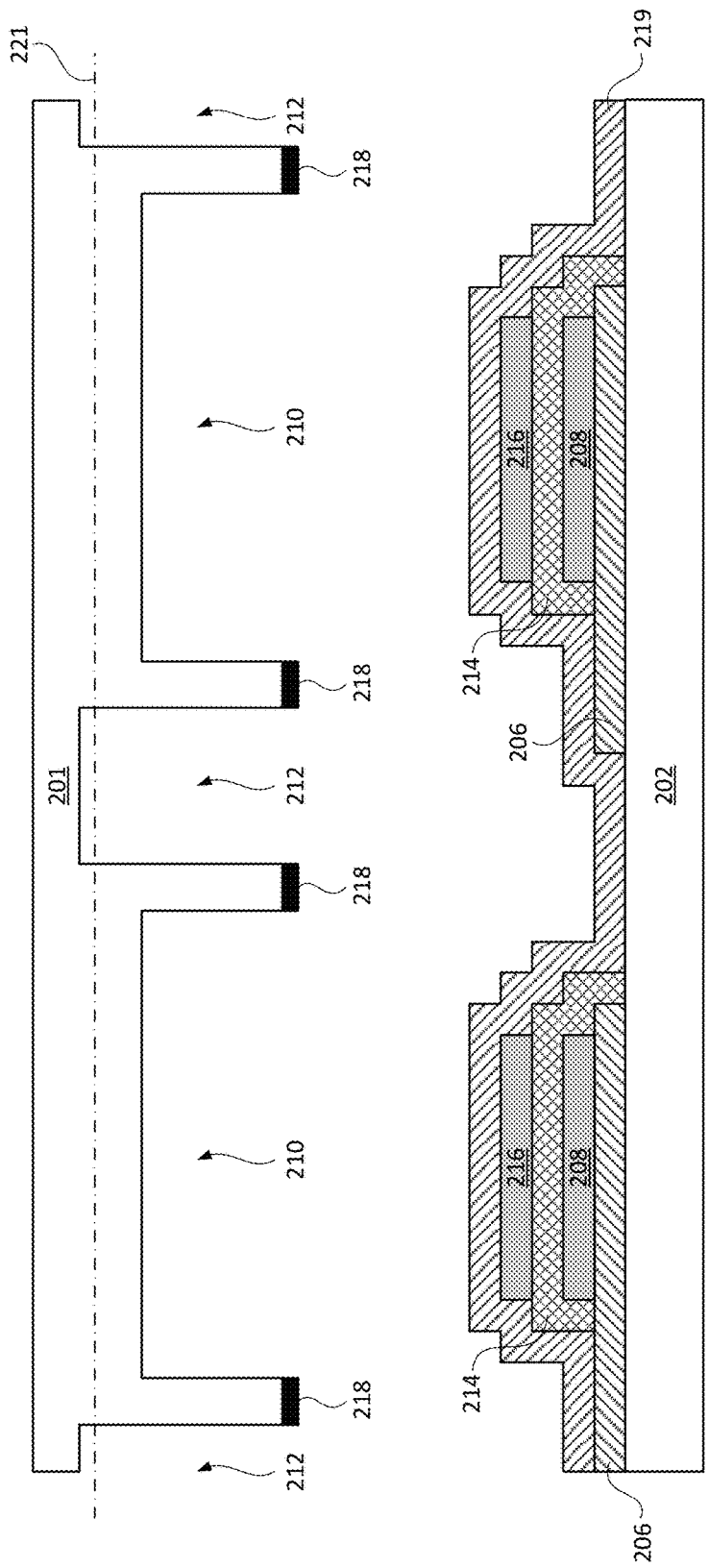

At the manufacturing stage shown in FIG. 2E, portions of the anode layer 215 may be etched to form anode components 216. A metal layer 219 may be formed on the anode components 216, the electrolyte components 214, and the cathode current collectors 206. The metal layer 219 may be formed of metals with good conductivity such as aluminum, copper, or gold. The thickness of the metal layer 219 may be in the range of a few microns. With appropriate masking techniques (not shown for brevity), the bonding material layer 218 in the cavities 210 and 212 may be removed, while leaving behind the bonding material layer 218 on remaining surfaces, as shown in FIG. 2E. Additionally, the top wafer 201 may be flipped vertically in preparation to be attached over the rechargeable power sources. A dotted line 221 demarks the level to which the top wafer 201 may be polished to form the capping wafers.

Figure 2F:
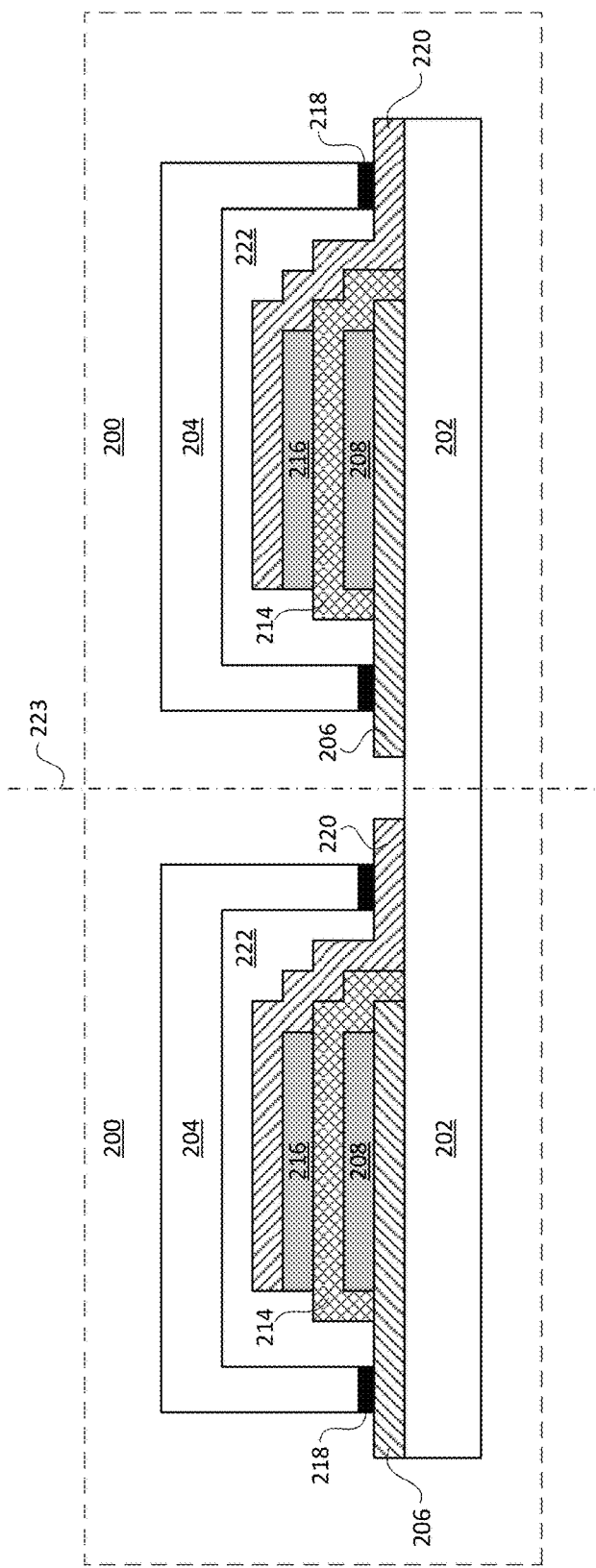

FIG. 2F depicts an even further stage in the manufacturing process, where portions of the metal layer 219 may be etched to form anode current collectors 220. At this point in the manufacturing process, the rechargeable power sources are formed. Within a vacuum chamber or a chamber containing an inert gas, the top wafer 201 may then be attached over the rechargeable power sources with the bonding material 118 at a low temperature, which may be below 200° C. Cavities 222, which contain either a vacuum or the inert gas, are thus formed. Subsequently, the top wafer 201 may be polished to the dotted line 221 shown in FIG. 2E to form capping wafers 204. The device wafer 202 may then be die cut at a dotted line 223 to form the individual wafer-capped rechargeable power sources 200.

It is to be appreciated that, even if FIGS. 2A-2F illustrate the manufacturing of two wafer-capped rechargeable power sources 200, a plurality of wafer-capped rechargeable power sources 200 may be formed simultaneously on a wafer of any conventional sizes.

Figure 3:
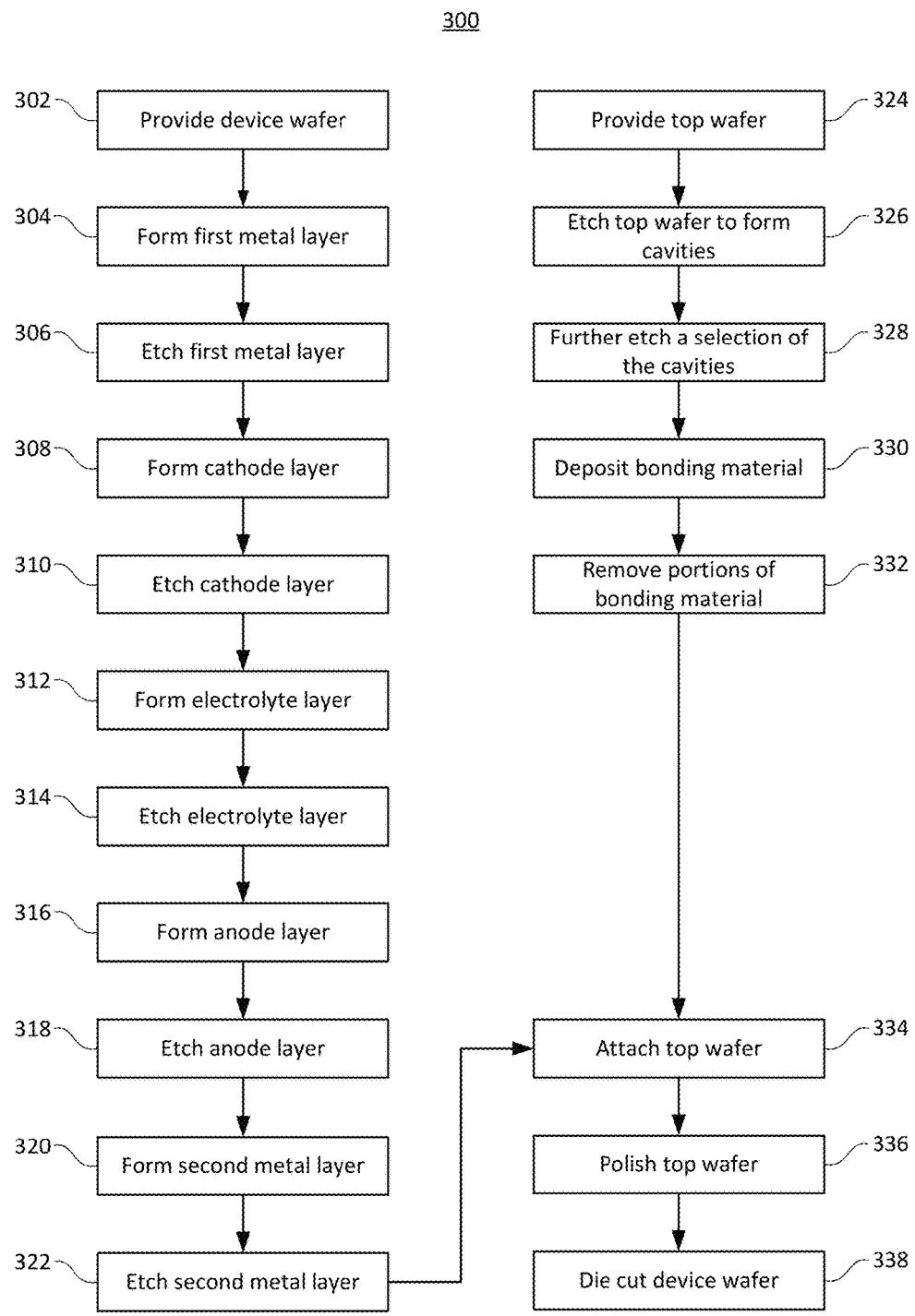
FIG. 3 is a flowchart depicting a method of manufacturing a wafer-capped rechargeable power source according to an embodiment of the present invention.

FIG. 3 illustrates a method 300 of manufacturing a plurality of wafer-capped rechargeable power sources according to an embodiment of the present invention. The discussion of FIG. 3 will make references to FIGS. 2A-2F, but it should be understood that the method 300 is not limited to the specific embodiments depicted in FIGS. 2A-2F, but is more generally applicable.

As shown in FIG. 3, the method 300 may comprise two paths—one to form rechargeable power sources and the other to form capping wafers—that may merge to eventually form a plurality of wafer-capped rechargeable power sources (e.g., the wafer-capped rechargeable power sources 200).

The first path of the method 300 begins at step 302 by providing a device wafer (e.g., the device wafer 202). At step 304, a first metal layer (e.g., the metal layer 205) is formed on one of the surfaces of the device wafer. Portions of the first metal layer are etched at step 306 to form cathode current collectors (e.g., the cathode current collectors 206). At step 308, a cathode layer (e.g., the cathode layer 207) is formed over the cathode current collectors. Portions of the cathode layer are etched at step 310 to form cathode components (e.g., the cathode components 208). At step 312, an electrolyte layer (e.g., the electrolyte layer 213) is formed over the cathode components and the cathode current collectors. Portions of the electrolyte layer are etched at step 314 to form electrolyte components (e.g., the electrolyte components 214) enclosing the cathode components. At step 316, an anode layer (e.g., the anode layer 215) is formed over the electrolyte components and the cathode current collectors. Portions of the anode layer are etched at step 318 to form anode components (e.g., the anode components 216). At step 320, a second metal layer (e.g., the metal layer 219) is formed over the anode components, the electrolyte components, and the cathode current collectors. Portion of the second metal layer are etched at step 322 to form the anode current collectors (e.g., the anode current collectors 220). At this point in the manufacturing process of method 300, the rechargeable power sources are formed.

The second path of the method 300 begins at step 324 by providing a top wafer (e.g., the top wafer 201). At step 326, portions of the top wafer are etched to form cavities (e.g., the cavities 210 and 212) that are deep enough to encapsulate the rechargeable power sources formed at step 322. At step 326, with appropriate masking techniques, a selection of the cavities formed at step 324 that will not encapsulate any rechargeable power source (e.g., the cavities 212) are further deepened by etching. At step 330, a bonding material layer (e.g., the bonding material layer 218) is deposited on the upper horizontal surfaces of the top wafer, including the horizontal surfaces within the cavities. With appropriate masking techniques, portions of the bonding material layer in all the cavities are removed (e.g., as shown in FIG. 2E). At this point of the manufacturing process of method 300, the top wafer is ready to be attached over the rechargeable power sources formed at step 322.

At step 334, the top wafer in the state described at step 332 is attached over the rechargeable power sources formed at step 322 with the bonding material at a low temperature, which may be below 200° C. The attachment is carried out within either a vacuum chamber or a chamber containing an inert gas such that vacuum or inter gas cavities (e.g., the cavities 222) are formed between the rechargeable power sources and the top wafer. The top wafer is polished at step 336 to form capping wafers (e.g., the capping wafers 204). The device wafer is die cut at step 338 to form a plurality of wafer-capped rechargeable power sources (e.g., the wafer-capped rechargeable power sources 200).

Figure 4:
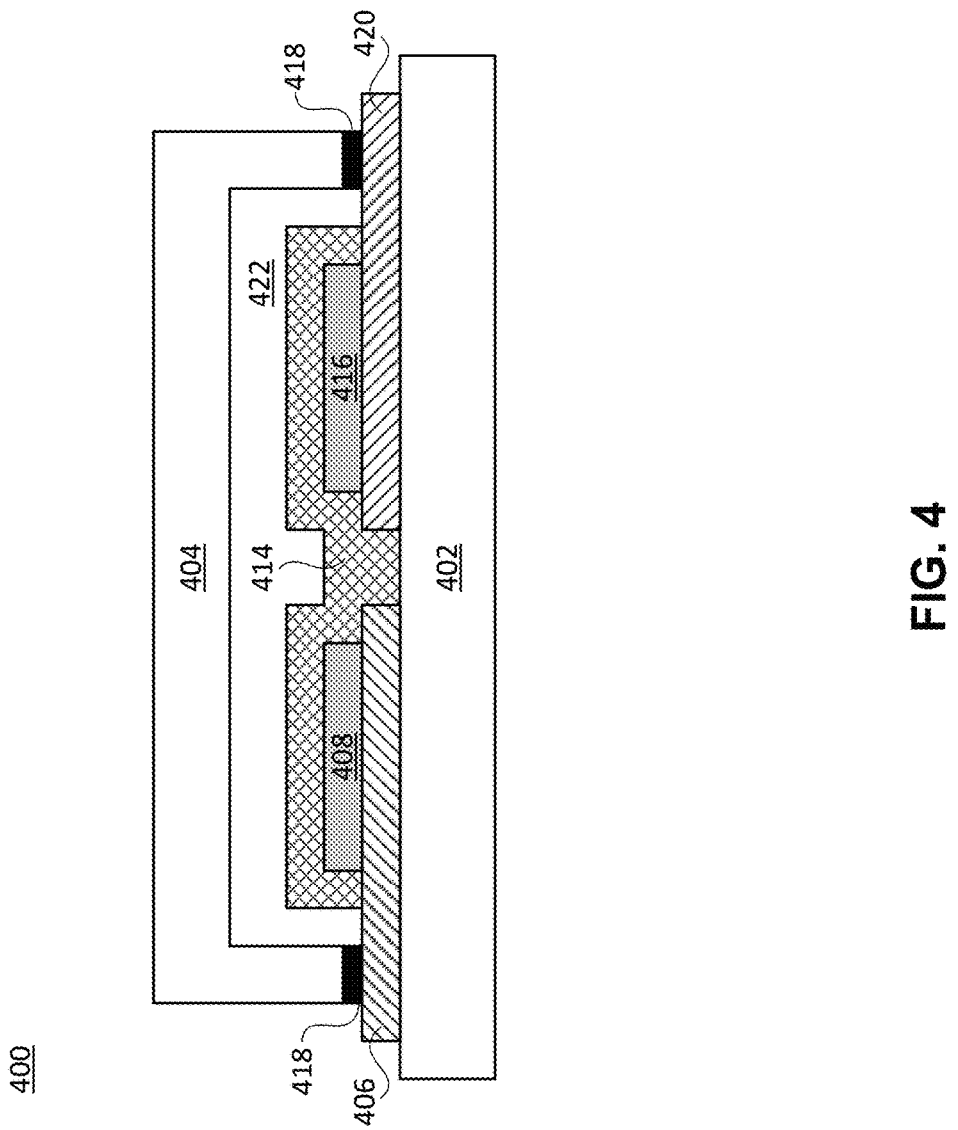
FIG. 4 illustrates a cross-section of a wafer-capped rechargeable power source according to an embodiment of the present invention.

FIG. 4 illustrates a cross-section of a wafer-capped rechargeable power source 400 according to an embodiment of the present invention. Similar to the wafer-capped rechargeable power source 100 or 200, the wafer-capped rechargeable power source 400 may include a device wafer 402, a capping wafer 404, a cathode current collector 406, a cathode component 408, an electrolyte component 414, an anode component 416, a bonding material 418, and an anode current collector 420. The wafer-capped rechargeable power source 400 may be manufactured in a substantially similar fashion as the wafer-capped rechargeable power source 100 or 200, using similar materials and under similar conditions. Unlike the wafer-capped rechargeable power source 100 or 200, for a given power density, the wafer-capped rechargeable power source 400 may allow for thinner, albeit wider, aspect ratio.

In FIG. 4, the cathode current collector 406 and the anode current collector 420 may be formed on the device wafer 402. The cathode component 408 and the anode component 416 may then be formed on the cathode current collector 406 and the anode current collector 420, respectively. As can be seen in FIG. 4, the cathode component 408 and the anode component 416 may substantially be formed in a same horizontal plane. The electrolyte component 414 is formed over the cathode component 408 and the anode component 416, effectively forming a rechargeable power source. The capping wafer 404 may be attached over the rechargeable power source with the bonding material 418 at a low temperature, which may be below 200° C.

Figure 5:
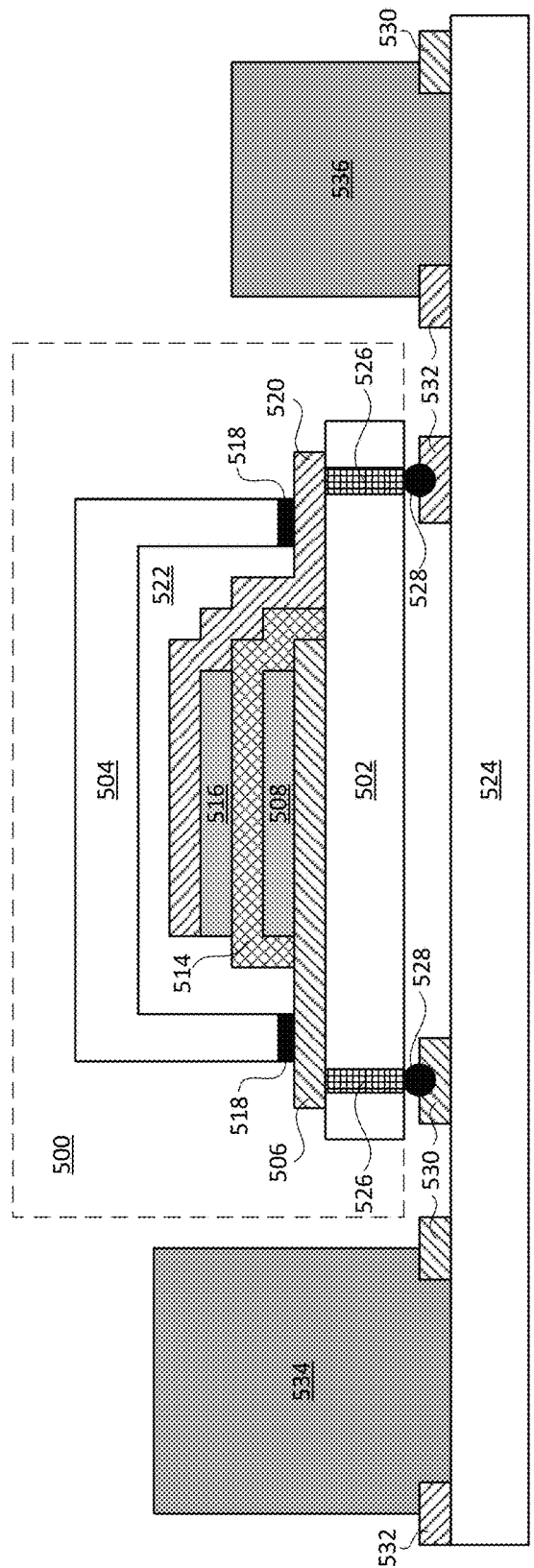
FIG. 5 illustrates a wafer-capped rechargeable power source integrated in a circuit according to an embodiment of the present invention.

FIG. 5 illustrates a wafer-capped rechargeable power source 500 integrated in a circuit according to an embodiment of the present invention. Similar to the wafer-capped rechargeable power source 100 or 200, the wafer-capped rechargeable power source 500 may include a device wafer 502, a capping wafer 504, a cathode current collector 506, a cathode component 508, an electrolyte component 514, an anode component 516, a bonding material 518, and an anode current collector 520. Additionally, the wafer-capped rechargeable power source 500 includes through-hole vias 526 such that the wafer-capped rechargeable power source 500 may be electrically connected to traces 530 and 532 of a circuit board 524 via solder balls 528.

The trace 530 may effectively connect to the cathode current collector 506 and the trace 532 to the anode current collector 520. The traces 530 and 532 may be routed and connected to at least one of a plurality of devices formed or mounted on the circuit board 524. For example, in FIG. 5, the traces 530 and 532 may be connected to devices 534 and 536. The devices 534 and 536 may either be powered by the wafer-capped rechargeable power source 500 or provide power to charge the wafer-capped rechargeable power source 500. For example, the device 534 may be a photodiode harvesting electromagnetic energy, which may then be stored in the wafer-capped rechargeable power source 500, and the device 536 may be a light-emitting diode (LED) with appropriate power conditioning components to convert power from the wafer-capped rechargeable power source 500 to light up the LED.

The circuit in FIG. 5, including the wafer-capped rechargeable power source 500, may be subsequently potted or enclosed in a plastic molding. Despite the typical high temperatures needed for plastic molding or potting, the capping wafer 504 may shield the rechargeable power source and prevents it from being degraded.

Figure 6:
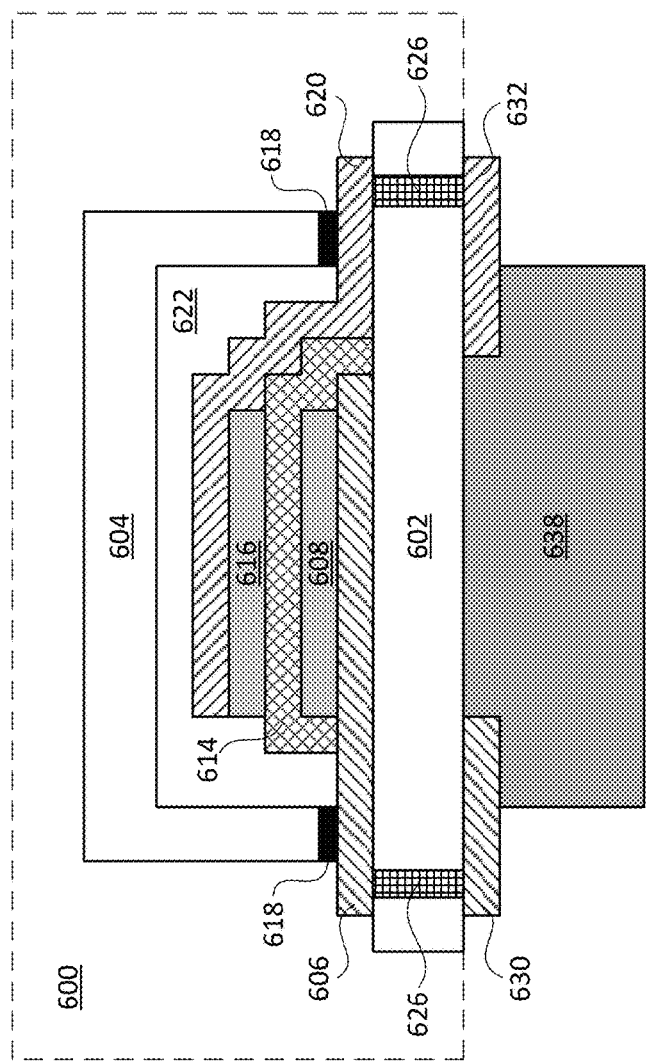
FIG. 6 illustrates a wafer-capped rechargeable power source integrated in a circuit according to an embodiment of the present invention.

FIG. 6 illustrates a wafer-capped rechargeable power source 600 integrated in a circuit according to an embodiment of the present invention. Similar to the wafer-capped rechargeable power source 100 or 200, the wafer-capped rechargeable power source 600 may include a device wafer 602, a capping wafer 604, a cathode current collector 606, a cathode component 608, an electrolyte component 614, an anode 616, a bonding material 618, and an anode current collector 620. Additionally, the wafer-capped rechargeable power source 600 includes through-hole vias 626 such that the wafer-capped rechargeable power source 600 may be electrically connected to traces 630 and 632 on an opposite active surface of the device wafer 602. The trace 630 may effectively connect to the cathode current collector 606 and the trace 632 to the anode current collector 620.

In FIG. 6, the traces 630 and 632 are shown to be connected to a single device 638 formed on the active surface of the device substrate 602. However, one skilled in the art would appreciate that the traces 630 and 632 may be connected to a plurality of devices that may be formed on the active surface of the device substrate 602. As in the circuit shown in FIG. 5, the wafer-capped rechargeable power source 600 may either provide power to or be charged by devices on the active surface of the device substrate 602.

Similar to the circuit in FIG. 5, the circuit in FIG. 6, including the wafer-capped rechargeable power source 600, may be subsequently potted or enclosed in a plastic molding. Despite the typical high temperatures needed for plastic molding or potting, the capping wafer 604 may shield the rechargeable power source and prevents it from being degraded.

Below is an explanation of certain terms used in this disclosure:

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The terms "forming," "form," "deposit," or "dispose" are used herein to describe the act of applying a layer of material to the substrate or another layer of material. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" or "wafer" as used throughout the descriptions is most commonly thought to be silicon. However, the substrate or wafer may also be any of a wide array of semiconductor materials such as germanium, gallium arsenide, indium phosphide, etc. In other embodiments, the substrate or wafer may be electrically non-conductive such as glass or sapphire.

As used herein, "mask" or "masking" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A device, comprising:
a device wafer;
a rechargeable power source disposed on a surface of the device wafer, the rechargeable power source including an anode component, a cathode component, a current collector, and an electrolyte component; and
a capping wafer coupled to the device wafer and configured to encapsulate the rechargeable power source in a cavity,
wherein the current collector extends from inside the cavity to outside the cavity.

2. The device of claim 1, further comprising an inert gas provided in the cavity.

3. The device of claim 1, further comprising a vacuum provided in the cavity.

4. The device of claim 1, further comprising a bonding material bonding the capping wafer to the device wafer.

5. The device of claim 1, wherein the electrolyte component includes an organic material.

6. The device of claim 1, wherein the electrolyte component includes an ionic liquid material.

7. The device of claim 1, wherein the current collector is a first current collector and the cathode component is formed on the first current collector on the device wafer, wherein the anode component is formed on a second current collector on the device wafer, and the electrolyte component is formed on the cathode component and the anode component, the second current collector extending from inside the cavity to outside the cavity.

8. The device of claim 7, wherein the cathode component and anode component are substantially formed in a same horizontal plane.

9. A circuit, comprising:
a circuit board; and
a device mounted on the circuit board, the device comprising:
a device wafer,
a rechargeable power source disposed on a surface of the device wafer and including a current collector, and
a capping wafer attached over the rechargeable power source forming a cavity between the rechargeable power source and the capping wafer,
wherein the current collector extends from inside the cavity to outside the cavity.

10. The circuit of claim 9, wherein the device is directly mounted on the circuit board with solder balls.

11. The circuit of claim 9, wherein the device is directly mounted on the circuit board with through-hole vias.

12. The circuit of claim 9, wherein the circuit further comprises a plurality of devices mounted on the circuit board, and wherein the device is electrically connected to at least one of the plurality of devices.

13. The circuit of claim 9, wherein the cavity is filled with an inert gas.

14. A device, comprising:
a device substrate;
a rechargeable power source disposed on a surface of the device substrate, the rechargeable power source including an anode, a cathode, a current collector, and an electrolyte; and
a capping wafer coupled to the device substrate and defining, at least in part, a cavity in which the rechargeable power source is disposed,
wherein the current collector extends from inside the cavity to outside the cavity.

15. The device of claim 14, further comprising an inert gas in the cavity.

16. The device of claim 14, further comprising a vacuum in the cavity.

17. The device of claim 14, wherein the capping wafer is attached over the rechargeable power source with a bonding material.

18. The device of claim 14, wherein the electrolyte includes an organic or ionic liquid material.

19. The device of claim 14, wherein the current collector is a first current collector and the cathode is formed on the first current collector on the device substrate, wherein the anode is formed on a second current collector on the device substrate, and the electrolyte is formed on the cathode and the anode.

20. The device of claim 14, wherein the cathode and anode are substantially formed in the same horizontal plane.

21. A capped rechargeable power source disposed on a surface of a device substrate, the capped rechargeable power source comprising:
a capping wafer forming, at least in part, a cavity; and a rechargeable power source disposed in the cavity, comprising:
an anode;
a cathode;
an electrolyte electrically coupled between the anode and cathode; and
a current collector coupled to the anode or cathode and extending from inside the cavity to outside the cavity.

22. The capped rechargeable power source of claim 21, further comprising an inert gas or vacuum in the cavity.

23. The capped rechargeable power source of claim 21, wherein the capping wafer is coupled to the device substrate with a bonding material.

24. The capped rechargeable power source of claim 21, wherein the electrolyte includes an organic or ionic liquid material.

25. The capped rechargeable power source of claim 21, wherein the current collector is a first current collector and the cathode is formed on the first current collector on the device substrate, wherein the anode is formed on a second current collector on the device substrate, and the electrolyte is formed on the cathode and the anode.

26. A circuit, including a capped rechargeable power source disposed within a cavity and on a surface of a device substrate, and including a current collector, the circuit comprising:
a capping wafer forming, at least in part, the cavity;
a circuit board; and
the capped rechargeable power source coupled to the circuit board;
wherein the current collector extends from inside the cavity to outside the cavity.

27. The circuit of claim 26, wherein a device comprising the capped rechargeable power source is directly mounted on the circuit board with solder balls.

28. The circuit of claim 26, wherein a device comprising the capped rechargeable power source is directly mounted on the circuit board with through-hole vias.

29. The circuit of claim 26, wherein the circuit further comprises a plurality of devices mounted on the circuit board, and wherein the capped rechargeable power source is electrically connected to at least one of the plurality of devices.

30. The circuit of claim 26, wherein the cavity is filled with an inert gas or vacuum.

* * * * *

UNITED STATES PATENT AND TRADEMARK OFFICE
CERTIFICATE OF CORRECTION

PATENT NO. : 10,446,331 B2
APPLICATION NO. : 14/861725
DATED : October 15, 2019
INVENTOR(S) : Baoxing Chen Page 1 of 1

It is certified that error appears in the above-identified patent and that said Letters Patent is hereby corrected as shown below:

In the Claims

In Claim 20, at Column 8, Line 63 delete "formed in the same horizontal plane." and replace it with --formed in a same horizontal plane.--

Signed and Sealed this
Fourth Day of February, 2020

Andrei Iancu
*Director of the United States Patent and Trademark Office*